(12) United States Patent
Halasyamani et al.

(10) Patent No.: US 8,999,189 B2
(45) Date of Patent: Apr. 7, 2015

(54) FERROELECTRIC FLUORIDE COMPOSITIONS AND METHODS OF MAKING AND USING SAME

(75) Inventors: P. Shiv Halasyamani, Houston, TX (US); Hong-Young Chang, Houston, TX (US)

(73) Assignee: University of Houston System, Houston, TX (US)

( * ) Notice: Subject to any disclaimer, the term of this patent is extended or adjusted under 35 U.S.C. 154(b) by 657 days.

(21) Appl. No.: 13/036,983

(22) Filed: Feb. 28, 2011

(65) Prior Publication Data

US 2011/0220836 A1    Sep. 15, 2011

Related U.S. Application Data

(60) Provisional application No. 61/311,957, filed on Mar. 9, 2010.

(51) Int. Cl.
| | |
|---|---|
| *H01F 1/01* | (2006.01) |
| *C30B 7/10* | (2006.01) |
| *C30B 29/12* | (2006.01) |
| *C01G 45/00* | (2006.01) |
| *C01G 51/00* | (2006.01) |
| *C01G 53/00* | (2006.01) |
| *C01G 9/00* | (2006.01) |
| *H01F 1/00* | (2006.01) |

(52) U.S. Cl.
CPC .. *H01F 1/01* (2013.01); *C30B 7/10* (2013.01); *C30B 29/12* (2013.01); *C01G 45/006* (2013.01); *C01G 51/006* (2013.01); *C01G 53/006* (2013.01); *C01G 9/006* (2013.01); *C01P 2002/72* (2013.01); *C01P 2002/76* (2013.01); *C01P 2002/77* (2013.01); *C01P 2006/10* (2013.01); *C01P 2006/42* (2013.01); *H01F 1/0009* (2013.01)

(58) Field of Classification Search
CPC ........... H01F 1/0009; H01F 1/01; C30B 7/10; C01G 45/006; C01G 51/006; C01G 53/006; C01G 9/006; C01P 2002/72; C01P 2002/74; C01P 2002/76; C01P 2002/10; C01P 2002/42
USPC ..................... 423/155; 252/62.51 C, 62.51 R
See application file for complete search history.

(56) References Cited

U.S. PATENT DOCUMENTS

| | | | | |
|---|---|---|---|---|
| 5,051,278 | A | * | 9/1991 | Paz-Pujalt ..................... 427/108 |
| 5,146,299 | A | * | 9/1992 | Lampe et al. ................. 257/295 |
| 5,271,956 | A | * | 12/1993 | Paz-Pujalt ..................... 427/108 |

FOREIGN PATENT DOCUMENTS

| | | |
|---|---|---|
| EP | 2545002 A2 | 1/2013 |
| WO | 2011112383 A2 | 9/2011 |
| WO | 2011112383 A3 | 9/2011 |

OTHER PUBLICATIONS

Fujihara (Sol-gel synthesis of inorganic complex fluorides using trifluoroacetic acid, Journal of Fluorine Chemistry, 2000, 105: 65-70).*
Xun (Hydrothermal synthesis of complex fluorides NaHoF4 and NaEuF4 with fluorite structures under mild conditions, Chem. Mater., 1997, 9: 2966-2968).*
Cao et al., Synthesis and characteriation of MgF2 and KMgF3 nanorods, Jornal of Solid State Chemistry 177, 2004, 2205-2209.*
Grob et al, Alkaline earth fluorides and their complexes: A sol-gel fluorination study, Solid State Sciences 9 (2007) 838-842.*
Filing receipt and specification for provisional patent application entitled "General method for the use of organic fluoro-acids as a reagent in the low temperature hydrothermal synthesis of ferroelectric fluorides," by P. Shiv Halasyamani, et al., filed Mar. 9, 2010 as U.S. Appl. No. 61/311,957.
Foreign communication from a related counterpart application—International Search Report and Written Opinion, PCT/US2011/026512, Nov. 25, 2011, 6 pages.
Foreign communication from a related counterpart application—International Preliminary Report on Patentability, PCT/US2011/026512, Sep. 11, 2012, 4 pages.
LeBlanc, M., et al., "Hydrothermal synthesis of transition metal fluorides in binary, ternary and quaternary systems," Mat. Res. Bull., 1984, pp. 1581-1590, vol. 19, Pergamon Press Ltd.
Zhao, Chunyan, et al., "Hydrothermal synthesis and lanthanide doping of complex fluorides, LiYF4, KYF4, and BaBeF4 under mild conditions," Chem. Commun., 1997, pp. 945-946.

* cited by examiner

*Primary Examiner* — Jun Li
(74) *Attorney, Agent, or Firm* — Conley Rose, P.C.; Rodney B. Carroll

(57) ABSTRACT

A method for synthesis of a ferroelectric material characterized by the general formula $A_xB_yF_z$ where A is an alkaline earth metal, B is transition metal or a main group metal, x and y each range from about 1 to about 5, and z ranges from about 1 to about 20 comprising contacting an alkaline earth metal fluoride, a difluorometal compound and a fluoroorganic acid in a medium to form a reaction mixture; and subjecting the reaction mixture to conditions suitable for hydrothermal crystal growth.

24 Claims, 2 Drawing Sheets

FERROELECTRIC FLUORIDE COMPOSITIONS AND METHODS OF MAKING AND USING SAME

CROSS-REFERENCE TO RELATED APPLICATIONS

This application claims priority to U.S. Provisional Patent Application Ser. No. 61/311,957, entitled "General Method for the Use of Organic Fluoro-Acids as a Reagent in the Low Temperature Hydrothermal Synthesis of Ferroelectric Fluorides," filed Mar. 9, 2010 and incorporated herein by reference in its entirety for all purposes.

STATEMENT REGARDING FEDERALLY SPONSORED RESEARCH OR DEVELOPMENT

This work was supported in part by grants from the Robert A. Welch Foundation Grant No.: E-1457 and the Department of Energy Office of Basic Energy Sciences Grant No. DE-SC0005032. The Government of the United States of America has certain rights in this invention.

FIELD OF THE INVENTION

The present disclosure relates to novel methods for the preparation of ferroelectric materials. More specifically, the present disclosure relates to a low temperature, hydrothermal 'one-pot' method for the synthesis of ferroelectric materials.

BACKGROUND OF THE INVENTION

There is currently a great deal of interest in magnetoelectric multiferroic materials, attributable to the possible interactions between the material's magnetic and ferroelectric properties. This magnetoelectric coupling aids in the manipulation of magnetic properties using an electric field, as well as the converse. Of particular interest, from both a fundamental science as well as an applied technologies perspective, is the switching of magnetic domains by an electric field and vice versa. In this situation, the electric field is used to drive the system into a different orientation of the same ground state. The different ground state remains stable even in the absence of the electric field, and thus exhibits the basic requirements for nonvolatile data storage. One class of magnetic ferroelectrics is the $BaMF_4$ family; where M=Mn, Fe, Co, or Ni. Such materials are known to be ferroelectric (i.e. exhibit reversible polarization) and to exhibit non-linear optical properties (i.e. frequency doublers for lasers). Two members of this family, namely $BaCoF_4$ and $BaNiF_4$, exhibit anti-ferromagnetic ordering at low temperatures. Such materials were originally synthesized utilizing a method that required high temperatures (e.g., 800° C.) under toxic conditions involving gaseous hydrofluoric acid.

Currently $BaMF_4$ is synthesized through two related methods. The first involves heating $BaF_2$ and $MF_2$ (M=Mg, Mn, Co, Ni, or Zn) to temperatures above 800° C. in a HF (hydrofluoric acid) atmosphere using a horizontal zone-melting method. One drawback to this method is the use of gaseous HF which requires extensive precautions as it can cause severe damage if mishandled. For example, exposure to gaseous HF can cause extreme respiratory irritation, immediate and severe eye damage and pulmonary edema. Skin, eye, or lung exposure to concentrated (>50%) HF solutions will cause immediate, severe, penetrating burns. Exposure to less concentrated solutions may have equally serious effects, but the appearance of symptoms can be delayed for up to 24 hours. In addition, the horizontal zone-melting method is experimentally difficult.

A second known method for the synthesis of $BaMF_4$ materials has been reported where $BaF_2$ and $MF_2$ (M=Mg, Mn, Co, Ni, and Zn) are melted in a platinum crucible at elevated temperatures (e.g., 800° C.), and crystals of $BaMF_4$ are grown using the Bridgeman method. The Bridgeman method involves heating a polycrystalline material in a container—in this case, a platinum crucible—above its melting point and slowly cooling it from one end where a seed crystal is located. Single crystals are formed along the length of the container. Drawbacks to these methods include both the expense and experimental complexity. Thus, there exists a need for an inexpensive, effective and less hazardous method for the synthesis ferroelectric materials.

BRIEF SUMMARY OF THE INVENTION

Disclosed herein is a method for synthesis of a ferroelectric material characterized by the general formula $A_xB_yF_z$ where A is an alkaline earth metal, B is a main group or transition metal, x and y each range from about 1 to about 5, and z ranges from about 1 to about 20 comprising contacting an alkaline earth metal fluoride, a difluorometal compound and a fluoro-organic acid in a medium to form a reaction mixture; and subjecting the reaction mixture to conditions suitable for hydrothermal crystal growth.

DETAILED DESCRIPTION OF THE INVENTION

Figure 1:
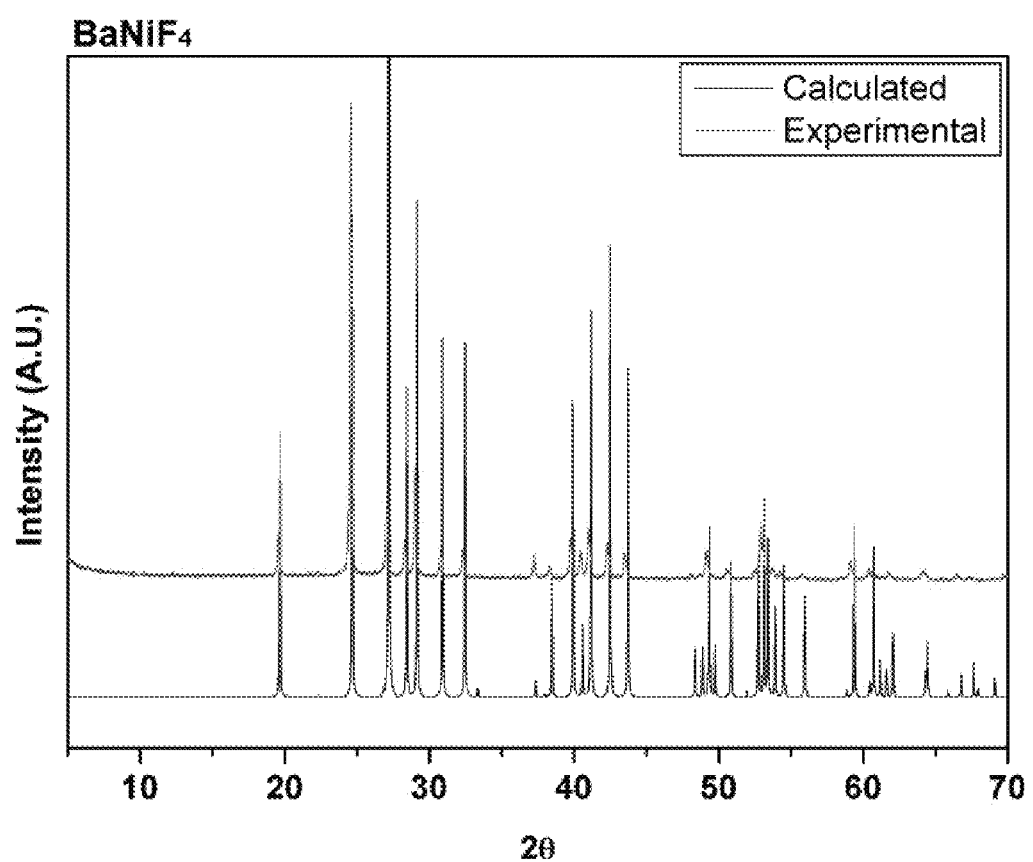
FIG. 1 is a powder X-ray diffraction pattern of $BaNiF_4$ in phase-pure form.

Disclosed herein are compositions comprising materials with advantageous electronic, magnetic, and/or optical properties and methods of making and using same. In an embodiment, the composition comprises a phase-pure ferroelectric material. Herein a ferroelectric material refers to a pyroelectric material whose macroscopic polarization may be reversed in the presence of an external electric field. In some embodiments, the ferroelectric materials are further characterized as multi-ferroic materials. Herein, multi-ferroic materials refer to materials possessing more than one "ferro" property such as ferroelectricity, ferroelasticity, and ferro, anti-ferro or ferrimagnetism.

Methods of synthesizing such materials may involve low-temperature hydrothermal synthetic techniques as will be described in more detail later herein. In an embodiment, synthesis of a ferroelectric material of the type disclosed herein is carried out using a "one-pot" methodology. Herein the one-pot methodology refers to a methodology of forming the ferroelectric material wherein the reagents are contacted and subjected to reaction conditions suitable for formation of the ferroelectric material without the isolation or manipulation of intermediates. In an embodiment, the methodologies disclose herein result in the bulk polycrystalline synthesis of a ferroelectric material. Additionally, the methodologies disclosed herein may provide advantages in terms of the use of less hazardous and less expensive reaction conditions.

In an embodiment, the ferroelectric material is characterized by the general formula $A_xB_yF_z$ where A is an alkali metal, alkaline earth metal, lead or an ammonium cation, B is a main group or transition metal, x and y each range from about 1 to about 5, and z ranges from about 1 to about 20. It is to be understood that F is the symbol for the element fluorine. In an embodiment, A comprises an alkaline metal such as lithium (Li), sodium (Na), potassium (K), rubidium (Rb) or cesium (Cs); an alkaline earth metal such as beryllium (Be), magnesium (Mg), calcium (Ca), strontium (Sr), or barium (Ba); lead (Pb), or an ammonium cation ($NH^{4+}$); and B comprises aluminum (Al), gallium (Ga), indium (In), silicon (Si), germanium (Ge), tin (Sn), phosphorus (P), arsenic (As), antimony (Sb), titanium (Ti), zinc (Zn), vanadium (V), niobium (Nb), tantalum (Ta), chromium (Cr), molybdenum (Mo), tungsten (W), manganese (Mn), iron (Fe), cobalt (Co), nickel (Ni) or copper (Cu). In an embodiment, the ferroelectric material is characterized by the general formula $BaMF_4$ where M is Ti, V, Nb, Ta, Cr, Mo, W, Mn, Fe, Co, Ni, or Cu. In an embodiment the ferroelectric material is $BaNiF_4$, $BaZnF_4$, $BaFeF_4$, $BaMnF_4$, or $BaCoF_4$. In another embodiment, the ferroelectric material comprises a material characterized by the general formula $Pb_5M_3F_{19}$ where M is Al, Ti, V, Cr, Ga, or Fe. In yet another embodiment, the ferroelectric material comprises $SrAlF_5$ or $Sr_3(FeF_6)$.

In an embodiment, the ferroelectric material is characterized by the formula $AMF_4$ where A is an alkaline earth metal and M is a transition metal or a second alkaline earth metal wherein the second alkaline earth metal differs from A. A method for synthesis of a ferroelectric material of the type described herein (e.g., a ferroelectric material characterized by the formula $AMF_4$) may comprise contacting an alkaline earth metal fluoride, hereinafter termed Component A, a difluorometal compound (DFM), and a fluoroorganic acid in an aqueous solution to form a reaction mixture. The reaction mixture may then be subjected to conditions suitable for hydrothermal crystal growth and formation of the ferroelectric material. In an embodiment, the method further comprises recovery of the ferroelectric material.

Hereinafter, this disclosure will focus on ferroelectric materials characterized by the general formula $AMF_4$ where A is an alkaline earth metal, and M is a transition metal or an alkaline earth metal that differs from the alkaline earth metal A. It is to be understood that additional ferroelectric materials such as those characterized by the general formula $A_xB_yF_z$ where A is an alkali metal, alkaline earth metal, lead or an ammonium cation, B is a main group or transition metal, x and y each range from about 1 to about 5, and z ranges from about 1 to about 20 are also contemplated.

In an embodiment, Component A (i.e., the alkaline earth metal fluoride) comprises Be, Mg, Ca, Sr, or Ba. Alternatively, Component A comprises Mg, Ca, or Ba, alternatively Ca or Ba. In an embodiment, Component A comprises Ba. Barium fluoride, also known as frankdicksonite, is widely commercially available. In an embodiment, Component A may be present in the reaction mixture in an amount of from about 0.075 g to about 0.190 g, alternatively from about 0.180 g to about 0.190 g, alternatively from about 0.125 g to about 0.175 g, or alternatively from about 0.075 g to about 0.120 g. In an embodiment, Component A may be present in the reaction mixture in amount of from about 0.01 mol. % to about 0.5 mol. % based on the total number of moles in the reaction mixture, alternatively from about 0.05 mol. % to about 0.25 mol. %, or alternatively from about 0.1 mol. % to about 0.2 mol. %.

In an embodiment, the DFM compound comprises any d-block element of the periodic table. For example, the DFM compound may comprise Ti, V, Nb, Ta, Cr, Mo, W, Mn, Fe, Zn, Co, or Ni. Alternatively, the DFM compound comprises Mn, Co, Fe, Zn, or Ni. In some embodiments, the DFM compound comprises an alkaline earth metal where the alkaline earth metal of the DFM compound differs from the alkaline earth metal of Component A. Alkaline earth metals suitable for use in the DFM compound include Be, Mg, Ca, Sr, or Ba. In an embodiment the DFM compound comprises Mg. In an embodiment, the DFM compound is an anhydrous compound; alternatively, the DFM compound is a hydrate having one or more water molecules associated with the compound. Nonlimiting examples of DFM compounds suitable for use in the present disclosure include $MnF_2$, $FeF_2$, $FeF_2 \cdot 4H_2O$, $CoF_2$, $CoF_2 \cdot 4H_2O$, $NiF_2$, $NiF_2 \cdot 4H_2O$, and combinations thereof.

In an embodiment the DFM compound is present in the reaction mixture in an amount of from about 0.075 g to about 0.400 g, alternatively from about 0.325 g to about 0.400 g alternatively from about 0.225 g to about 0.300 g, or alternatively from about 0.075 g to about 0.150 g. In an embodiment, the DFM compound is present in the reaction mixture in amount of from about 0.10 mol. % to about 1.00 mol. % based on the total number of moles in the reaction mixture, alternatively from about 0.3 mol. % to about 0.80 mol. %, or alternatively from about 0.50 mol. % to about 0.75 mol. %.

In an embodiment, the fluoroorganic acid comprises a perfluorinated carboxylic acid. A perfluorinated carboxylic acid suitable for use in this disclosure may have a carbon chain length of from 2 to 12 carbons, alternatively from 2 to 8 carbons, or alternatively from 2 to 4 carbons. Nonlimiting examples of fluoroorganic acids suitable for use in this disclosure include perfluorohexanoic acid (PFHxA), perfluoroheptanoic acid (PFHpA), perfluorooctanoic acid (PFOA), perfluorononanoic acid (PFNA), perfluorodecanoic acid (PFDA), trifluoroacetic acid, and combinations thereof. In an embodiment, the perfluorinated carboxylic acid comprises trifluoroacetic acid. In an embodiment, the fluoroorganic acid is present in the reaction mixture in an amount of from about 1 ml to about 6 ml, alternatively from about 1 ml to about 2 ml alternatively from about 3 ml to about 4 ml alternatively from about 4 ml to about 6 ml when using a base trifluoroacetic acid stock solution having 99% purity. In an embodiment, the fluoroorganic acid is present in the reaction mixture in amount of from about 5 mol. % to about 25 mol. % based on the total number of moles in the reaction mixture, alternatively from about 10 mol. % to about 20 mol. %, or alternatively from about 15 mol. % to about 19 mol. %.

It will be understood by the ordinarily skilled artisan that HF in solution may be used in lieu of or in combination with the aforementioned fluoroorganic acids. However, the use of HF in solution will not provide many of the advantageous aspects associated with the use of a fluoroorganic acid as instantly disclosed such as the disclosed product purity and less hazardous reaction conditions.

In an embodiment, the alkaline earth metal fluoride, DFM compound and fluoroorganic acid are present in any amount sufficient to provide a molar ratio of alkaline earth metal fluoride to DFM compound of from about 10:1 to about 1:1, alternatively of from about 8:1 to about 2:1 alternatively of from about 6:1 to about 4:1.

In an embodiment, the reaction mixture comprises $BaF_2$, $NiF_2$, and trifluoroacetic acid in the amounts previously disclosed herein. In an embodiment, the reaction mixture comprises $BaF_2$, $MnF_2$, and trifluoroacetic acid in the amounts previously disclosed herein. In an embodiment, the reaction mixture comprises $BaF_2$, $ZnF_2$, and trifluoroacetic acid in the amounts previously disclosed herein. In an embodiment, the reaction mixture comprises $BaF_2$, $CoF_2$, and trifluoroacetic acid in the amounts previously disclosed herein.

In an embodiment, contacting of the aforementioned materials (i.e., alkaline earth metal fluoride, DFM, and fluoroorganic acid) is carried out in an aqueous medium comprising greater than about 20% water, alternatively greater than about 40% water, or alternatively greater than about 50% water. In an embodiment, water constitutes the remainder of the reaction mixture when all other components are taken into account. In some embodiments, the aqueous medium comprises one or more non-aqueous components that are miscible with the water to form a mixed reaction medium. As will be understood by the ordinarily skilled artisan the presence of other non-aqueous components in the reaction mixture may detrimentally affect the solubility of one or more of the aforementioned reagents. Additionally, the presence of the non-aqueous component may result in one or more side reactions that could detrimentally impact production of the desired material. Consequently, the non-aqueous component of the reaction medium may be present in an amount that does not materially impact the amount and/or purity of the final product, the ferroelectric material. In an embodiment, the non-aqueous component may be present in an amount that reduces the yield of ferroelectric material by less than about 5%, 4%, 3%, 2%, or 1% when compared to a reaction carried out in the absence of the non-aqueous component. In an embodiment, the non-aqueous component may be present in an amount that reduces the purity of the ferroelectric material produced by less than about 1%, 0.5%, 0.4%, 0.3%, 0.2%, 0.1%, 0.05%, or 0.01% when compared to a reaction carried out in the absence of the non-aqueous component.

In an embodiment, the method further comprises subjecting the reaction mixture to conditions suitable for hydrothermal crystal growth. For example, the reaction mixture may be subjected to a temperature of from about 150° C. to about 250° C. alternatively from about 150° C. to about 240° C., alternatively from about 150° C. to about 230° C. and a pressure of from about 5 atm to about 75 atm alternatively from about 10 atm to about 50 atm or alternatively from about 20 atm to about 40 atm. In some embodiments, the reaction mixture may be subjected to an autoclave. The reaction mixture may be autoclaved for a time period sufficient to produce some user and/or process-desired amount and/or purity of ferroelectric material. For example, the reaction time period under the aforementioned temperature and pressure conditions may be from about 1 day to about 3 days, alternatively from about 1 day to about 2.5 days, alternatively from about 1 day to about 2 days.

In an embodiment, the method may include the step of isolating the ferroelectric material by filtering the solution to remove the particulate materials. In some embodiments, the method may include a purification step wherein the ferroelectric material may be purified by washing with a solvent.

The methodologies disclosed herein may result in yields of ferroelectric material equal to or greater than about 50%, alternatively equal to or greater than about 75%, alternatively equal to or greater than about 80%, or alternatively equal to or greater than about 90% based on the amount of alkaline metal fluoride (i.e., Component A) in the reaction mixture. In an embodiment, the methodology disclosed herein may be carried out on a scale sufficient to result in the single-batch production of ferroelectric materials in an amount of equal to or greater than about 0.5 grams, alternatively equal to or greater than about 1.0 gram, alternatively equal to or greater than about 5.0 grams. Herein single-batch production refers to a reaction mixture being subjected once to the aforementioned reaction conditions for the aforementioned time period before the ferroelectric material is recovered.

The methodologies disclosed herein may result in the production of phase-pure ferroelectric materials. Herein a phase-pure ferroelectric material refers to a material having a phase purity of greater than about 99% as measured by x-ray diffraction. Measurements of the phase-purity of the ferroelectric material may be carried out in accordance with the International Centre for Diffraction Data (www.icdd.com). In an embodiment, only diffraction peaks associated with the $BaMF_4$ (M=Mg, Mn, Co, Ni, Zn) phases are observed.

Ferroelectric materials of the type described herein may exhibit piezoelectric charge constants in the range of from about 5 to about 200 pC/N, alternatively from about 10 pC/N to about 180 pC/N, or alternatively from about 20 pC/N to about 160 pC/N. Herein the piezoelectric charge constant, d, refers to the polarization generated per unit of mechanical stress (T) applied to a ferroelectric material or, alternatively, is the mechanical strain (S) experienced by a ferroelectric material per unit of electric field applied.

Ferroelectric materials of the type described herein may exhibit piezoelectric voltage constants in the range of from about 5 pm/V to about 200 pm/V, alternatively from about 10 pm/V to about 180 pm/V, or alternatively from about 15 pm/V to about 160 pm/V. Herein the piezoelectric voltage constant, g, refers to the electric field generated by a ferroelectric material per unit of mechanical stress applied or, alternatively, is the mechanical strain experienced by a ferroelectric material per unit of electric displacement applied.

Ferroelectric materials of the type described herein may exhibit polarization values in the range of from about 5 $\mu C/cm^2$ to about 25 $\mu C/cm^2$ alternatively from about 5 $\mu C/cm^2$ to about 22 $\mu C/cm^2$, or alternatively from about 5 $\mu C/cm^2$ to about 20 $\mu C/cm^2$. The polarization for a ferroelectric material is in microcoulombs per square centimeter.

The ferroelectric materials of this disclosure may display one or more "ferro" properties of the type previously described herein. In an embodiment, ferroelectric materials of the type disclosed herein may be suitably employed in a number of applications. Nonlimiting examples of products and/or applications where ferroelectric materials of the type described herein may be suitably employed include tunable capacitors, thin films, memory devices, pyroelectric sensors, surface acoustic wave substrates, gas ignitors, displacement transducers, accelerometers, piezoelectric transformers, impact printer heads, and actuators.

In an embodiment, a ferroelectric material of the type disclosed herein may display a characteristic color. In such embodiments, the ferroelectric material may be incorporated into a composition and influence the color of at least a portion of the composition. In such embodiments, the ferroelectric material may serve as a pigment for at least a portion of the composition. The ferroelectric material may be included in the composition in amounts sufficient to influence the color of the composition. In an embodiment, the ferroelectric material is present in the composition in an amount sufficient to influence the color of the entire composition. In other embodiments, the ferroelectric material is present in the composition in amounts sufficient to influence the color of the composition while not materially affecting the beneficial properties of the composition.

In an embodiment, a ferroelectric material of the type disclosed herein is used in the production of a thin film. Such films may be prepared using any suitable methodology and are hereinafter designated TF-X. In an embodiment, the TF-X is employed in applications involving nonvolatile memory, capacitors, pyroelectric sensors, surface acoustic wave (SAW) substrates, optical waveguides, optical memories and displays or combinations thereof.

EXAMPLES

The disclosure having been generally described, the following examples are given as particular embodiments of the disclosure and to demonstrate the practice and advantages thereof. It is understood that the examples are given by way of illustration and are not intended to limit the specification of the claims to follow in any manner.

Example 1

The methodology disclosed herein was utilized to synthesize various ferroelectric materials. The starting reagents, amount of each reagent and yield of final product are presented in Table 2. Each of the ferroelectric materials listed in Table 2 (i.e., $BaMgF_4$, $BaMnF_4$, $BaCoF_4$, $BaNiF_4$, and $BaZnF_4$) were synthesized by combining the reagents listed into separate 23 ml Teflon-lined autoclaves where the vessel pressure was maintained at 20 atm. The autoclaves were heated to 230° C. for 24 hours and cooled to room temperature at a rate of 6° C. per hour. The mother liquor was decanted from the products and the products were recovered by filtration and washed with distilled water. A powder X-ray diffraction pattern of $BaNiF_4$ was obtained and is shown in FIG. 1. The powder X-ray diffraction pattern is consistent with that of $BaNiF_4$ in phase-pure form. Referring to Table 1, the calculated and experimental two theta values are in excellent agreement. Crystallographic quality crystals were also obtained for $BaMnF_4$ and $BaCoF_4$ The crystallographic information obtained for $BaNiF_4$, $BaMnF_4$ and $BaCoF_4$ is presented in Tables 3, 4 and 5 which provide crystallographic data, atomic coordinates and selected bond distances respectively. Bond distances are given in units of Angstroms. The crystallographic information obtained for these materials is consistent with the formation of the phase-pure form of each of these materials.

TABLE 1

BaNiF4
X-ray Diffraction Data

| 2theta (calc) | 2theta (exp) |
|---|---|
| 19.68 | 19.7 |
| 24.68 | 24.7 |
| 27.22 | 27.3 |
| 28.46 | 28.5 |
| 29.18 | 29.2 |
| 30.94 | 30.1 |
| 32.48 | 32.5 |
| 38.5 | 38.6 |
| 39.97 | 40 |
| 40.63 | 40.7 |
| 41.21 | 41.3 |
| 42.53 | 42.6 |
| 43.76 | 43.8 |
| 48.41 | 48.5 |
| 48.92 | 49 |
| 49.39 | 49.4 |
| 49.79 | 49.8 |
| 50.88 | 50.1 |
| 52.79 | 52.8 |
| 53.19 | 53.2 |
| 53.46 | 53.5 |
| 53.94 | 54 |
| 54.55 | 54.6 |
| 56.01 | 56.1 |
| 59.43 | 59.5 |

TABLE 2

|  | $BaMgF_4$ | $BaMnF_4$ | $BaCoF_4$ | $BaNiF_4$ | $BaZnF_4$ |
|---|---|---|---|---|---|
| $BaF_2$ | 0.187 g | 0.200 g | 0.150 g | 0.100 g | 0.180 g |
| $MF_2$ | 0.245 $g^a$ | 0.106 g | 0.110 g | 0.385 $g^a$ | 0.351 $g^b$ |
| $CF_3COOH$ | 4 mL | 2 mL | 2 mL | 3 mL | 5 mL |
| $H_2O$ | 5 mL | 5 mL | 5 mL | 5 mL | 4 mL |
| Yield$^c$ | 70% | 80% | 70% | 80% | 80% |

$^a$For $BaMgF_4$, $Mg(ac)_2 \cdot 4H_2O$ was used.
$^b$For $BaNiF_4$ and $BaZnF_4$, $MF_2 \cdot 4H_2O$ was used.
$^c$Yields based on $BaF_2$.

TABLE 3

| formula | $BaNiF_4$ | $BaCoF_4$ | $BaMnF_4$ |
|---|---|---|---|
| fw (g/mol) | 544.10 | 544.54 | 536.56 |
| T (K) | 296(2) | 296(2) | 296(2) |
| λ (Å) | 0.71073 | 0.71073 | 0.71073 |
| crystal system | orthorhombic | orthorhombic | orthorhombic |
| space group | Cmc21 (No. 36) | Cmc21 (No. 36) | Cmc21 (No. 36) |
| a (Å) | 4.1591(9) | 4.2173(4) | 4.2413(8) |
| b (Å) | 14.492(3) | 14.6573(14) | 15.182(3) |
| c (Å) | 5.8078(12) | 5.8685(6) | 6.0247(12) |
| V (Å3) | 350.06(13) | 362.58(6) | 387.95(13) |
| Z | 2 | 2 | 2 |
| ρcalcd (g/cm3) | 5.162 | 4.988 | 4.593 |
| μ(mm−1) | 16.484 | 15.297 | 13.276 |
| 2θmax (deg) | 56.22 | 57.66 | 57.94 |
| R (int) | 0.0442 | 0.0161 | 0.0198 |
| flack parameter | 0.20(9) | 0.65(5) | 0.71(5) |
| GOF | 1.126 | 1.158 | 1.217 |
| R (F)a | 0.0262 | 0.0160 | 0.0206 |
| Rw (Fo2)b | 0.0501 | 0.0412 | 0.0541 |

TABLE 4

|  | x | y | z | $U_{eq}$ |
|---|---|---|---|---|
| $BaNiF_4$ | | | | |
| Ba | 0 | 0.14581(5) | 0.75583(7) | 0.0148(2) |
| Ni | 0 | 0.41216(10) | 0.7195(3) | 0.0098(4) |
| F(1) | 0 | 0.3020(6) | 0.5174(15) | 0.012(2) |
| F(2) | 0 | 0.3329(7) | 0.9893(15) | 0.015(2) |
| F(3) | 0 | 0.5243(6) | 0.9061(15) | 0.0162(17) |
| F(4) | 0 | −0.0798(5) | 0.7147(16) | 0.0188(18) |
| $BaCoF_4$ | | | | |
| Ba | 0 | 0.14761(2) | 0.96412(7) | 0.01639(17) |
| Co | 0 | 0.58712(5) | 0.50364(15) | 0.0103(2) |
| F(1) | 0 | 0.3004(3) | 0.2033(7) | 0.0170(10) |
| F(2) | 0 | 0.3332(3) | 0.7283(8) | 0.0183(9) |
| F(3) | 0 | 0.5284(3) | 0.8245(7) | 0.0201(9) |
| F(4) | 0 | −0.0796(3) | 0.0102(9) | 0.0275(12) |
| $BaMnF_4$ | | | | |
| Ba | 0 | 0.34415(3) | 0.53196(5) | 0.01745(15) |
| Mn | 0 | 0.08408(7) | 0.57713(18) | 0.0092(3) |
| F(1) | 0 | 0.2002(3) | 0.7766(8) | 0.0167(12) |
| F(2) | 0 | 0.1645(4) | 0.3005(10) | 0.0214(13) |
| F(3) | 0 | −0.0362(3) | 0.4145(9) | 0.0254(12) |
| F(4) | 0 | 0.4212(4) | 0.0972(12) | 0.0430(19) |

TABLE 5

|  | BaNiF4 | BaCoF4 | BaMnF4 |
|---|---|---|---|
| Ba—F(1) × 1 | 2.654(9) | 2.643(4) | 2.636(5) |
| Ba—F(1) × 2 | 2.684(6) | 2.714(3) | 2.705(3) |
| Ba—F(2) × 2 | 2.611(5) | 2.632(3) | 2.671(4) |
| Ba—F(2) × 1 | 3.031(10) | 3.052(5) | 3.052(6) |
| Ba—F(3) × 2 | 2.861(5) | 2.858(3) | 2.881(3) |
| Ba—F(4) × 1 | 2.831(9) | 2.843(5) | 2.869(7) |

TABLE 5-continued

|  | BaNiF4 | BaCoF4 | BaMnF4 |
|---|---|---|---|
| Ba—F(4) × 1 | 3.279(7) | 3.341(4) | — |
| Ba—F(4) × 1 | 3.285(9) | 3.355(5) | — |
| M-F(1) × 1 | 1.981(9) | 2.022(4) | 2.134(5) |
| M-F(2) × 1 | 1.944(9) | 1.993(5) | 2.074(6) |
| M-F(3) × 1 | 1.953(8) | 1.993(4) | 2.072(5) |
| M-F(3) × 1 | 2.040(9) | 2.069(4) | 2.159(5) |
| M-F(4) × 2 | 2.0830(7) | 2.1119(2) | 2.1256(7) |

Figure 2:
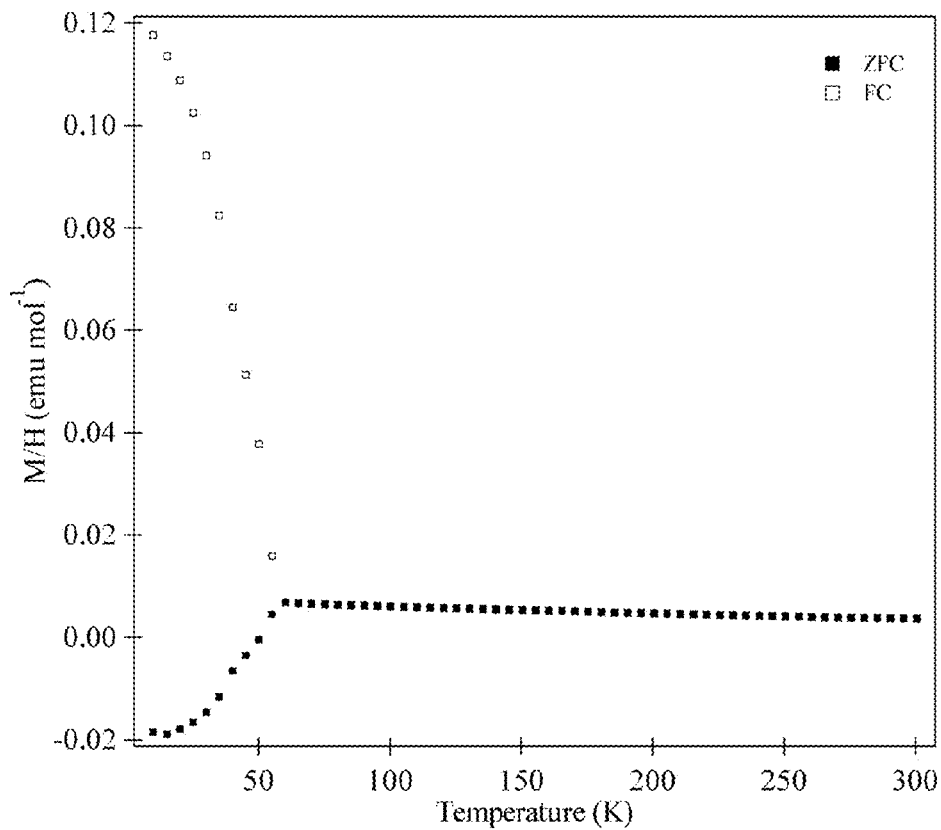
FIG. 2 is a plot of the magnetic susceptibility as a function of temperature for the materials of example 1.

Magnetic susceptibility measurements were performed on $BaNiF_4$ to confirm the magnetic ordering for field cooled (FC) at 100 Oe and zero field cooled (ZFC) magnetization and these results are presented in FIG. 2. The ZFC magnetization curve is obtained after cooling the sample in zero field from high temperature by measuring the magnetization for stepwise increases in temperature in a small applied field. The FC magnetization curve is obtained by measuring magnetization in the cooling process in the same small applied field. Referring to FIG. 2, an antiferromagnetic transition at 60 K was observed.

While embodiments of the invention have been shown and described, modifications thereof can be made without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_L$, and an upper limit, $R_U$, is disclosed, any number falling within the range is specifically disclosed. In particular, the following numbers within the range are specifically disclosed: $R=R_L+k*(R_U-R_L)$, wherein k is a variable ranging from 1 percent to 100 percent with a 1 percent increment, i.e., k is 1 percent, 2 percent, 3 percent, 4 percent, 5 percent, ... 50 percent, 51 percent, 52 percent, ..., 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc., should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the embodiments of the present invention. The discussion of a herein is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

What is claimed is:

1. A method for synthesis of a ferroelectric material characterized by the general formula $A_xB_yF_z$ where A is an alkaline earth metal, B is transition metal or a main group metal, x and y each range from about 1 to about 5, and z ranges from about 1 to about 20 comprising:
   contacting an alkaline earth metal fluoride, a difluorometal compound and a fluoroorganic acid in a medium to form a reaction mixture; and
   subjecting the reaction mixture to conditions suitable for hydrothermal crystal growth comprising a temperature of from about 150° C. to about 250° C. and a pressure of from about 5 atm to about 75 atm.

2. The method of claim 1 wherein the alkaline earth metal fluoride comprises Be, Mg, Ca, Sr, or Ba.

3. The method of claim 1 wherein the alkaline earth metal fluoride comprises barium fluoride.

4. The method of claim 1 wherein the alkaline earth metal fluoride is present in the reaction mixture in an amount of from about 0.01 mol % to about 0.5 mol. %.

5. The method of claim 1 wherein the difluorometal compound comprises Ti, V, Nb, Ta, Cr, Mo, W, Mn, Fe, Zn, Co, or Ni.

6. The method of claim 1 wherein the difluorometal compound is anhydrous.

7. The method of claim 1 wherein the difluorometal compound comprises $NiF_2$, $MnF_2$, $ZnF_2$, $CoF_2$ or $FeF_2$.

8. The method of claim 1 wherein the diflurorometal compound is present in the reaction mixture in an amount of from about 00.1 mol. % to about 1.00 mol. %.

9. The method of claim 1 wherein the fluoroorganic acid comprises a perfluorinated carboxylic acid.

10. The method of claim 9 wherein the perfluorinated carboxylic acid comprises perfluorohexanoic acid (PFHxA), perfluoroheptanoic acid (PFHpA), perfluorooctanoic acid (PFOA), perfluorononanoic acid (PFNA), perfluorodecanoic acid (PFDA), trifluoroactetic acid, or combinations thereof.

11. The method of claim 1 wherein the fluoroorganic acid comprises trifluoroacetic acid.

12. The method of claim 1 wherein the fluoroorganic acid is present in the reaction mixture in an amount of from about 5 mol. % to about 25 mol. %.

13. The method of claim 1 wherein the reaction medium comprises water.

14. The method of claim 1 wherein the mole ratio of alkaline earth metal fluoride to difluorometal compound is from about 10:1 to about 1:1.

15. The method of claim 1 wherein the alkaline earth metal fluoride comprises barium fluoride, the difluorometal compound comprises $NiF_2$, the fluoroorganic acid comprises trifluoroacetic acid and the ferroelectric material comprises $BaNiF_4$.

16. The method of claim 1 wherein the alkaline earth metal fluoride comprises barium fluoride, the difluorometal compound comprises $MnF_2$, the fluoroorganic acid comprises trifluoroacetic acid and the ferroelectric material comprises $BaMnF_4$.

17. The method of claim 1 wherein the alkaline earth metal fluoride comprises barium fluoride, the difluorometal compound comprises $ZnF_2$, the fluoroorganic acid comprises trifluoroacetic acid and the ferroelectric material comprises $BaZnF_4$.

18. The method of claim 1 wherein the conditions for hydrothermal crystal growth comprise a reaction time period of from about 1 day to about 3 days.

19. The method of claim 1 wherein the yield of ferroelectric material is equal to or greater than about 50%.

20. The method of claim 1 wherein the ferroelectric material exhibits greater than about 99% phase purity.

21. The method of claim 1 wherein the ferroelectric material has a piezoelectric charge constant of from about 5 pC/N to about 200 pC/N.

22. The method of claim 1 wherein the ferroelectric material has a piezoelectric voltage constant of from about 5 pm/V to about 200 pm/V.

23. The method of claim 1 wherein the ferroelectric material has a polarization value ranging from about 5 $\mu C/cm^2$ to about 25 $\mu C/cm^2$.

24. A method for synthesis of a ferroelectric material characterized by the general formula $A_xB_yF_z$ where A is an alkaline earth metal, B is transition metal or a main group metal, x and y each range from about 1 to about 5, and z ranges from about 1 to about 20 comprising:

contacting an alkaline earth metal fluoride, a difluorometal compound and a fluoroorganic acid in a medium to form a reaction mixture; and subjecting the reaction mixture to conditions suitable for hydrothermal crystal growth wherein the ferroelectric material has a piezoelectric charge constant of from about 5 pC/N to about 200 pC/N and the hydrothermal reaction being carried out at a temperature of 150-250° C. and a pressure of 5 atm to 75 atm.

* * * * *